United States Patent
Lin et al.

(10) Patent No.: US 9,938,134 B2
(45) Date of Patent: Apr. 10, 2018

(54) GETTER ELECTRODE TO IMPROVE VACUUM LEVEL IN A MICROELECTROMECHANICAL SYSTEMS (MEMS) DEVICE

(71) Applicant: Taiwan Semiconductor Manufacturing Co., Ltd., Hsin-Chu (TW)

(72) Inventors: Shiang-Chi Lin, Taoyuan (TW); Jung-Huei Peng, Jhubei (TW); Yu-Chia Liu, Kaohsiung (TW); Yi-Chien Wu, Taichung (TW); Wei Siang Tan, Hsinchu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 15/205,619

(22) Filed: Jul. 8, 2016

(65) Prior Publication Data
US 2017/0297904 A1  Oct. 19, 2017

Related U.S. Application Data

(60) Provisional application No. 62/322,263, filed on Apr. 14, 2016.

(51) Int. Cl.
*B81B 7/00* (2006.01)
*B81C 1/00* (2006.01)
(Continued)

(52) U.S. Cl.
CPC ........ *B81B 7/0038* (2013.01); *B81C 1/00285* (2013.01); *B81B 2201/0235* (2013.01);
(Continued)

(58) Field of Classification Search
CPC .......... B81B 7/0038; B81B 2201/0242; B81B 2201/0235; B81B 2203/04; B81B 2207/07; B81C 1/00285; B81C 2201/013; B81C 2201/016; B81C 2203/0109; B81C 2203/0714
(Continued)

(56) References Cited

U.S. PATENT DOCUMENTS 8,987,059 B2   3/2015   Liang et al.
9,040,334 B2   5/2015   Chu et al.
(Continued)

OTHER PUBLICATIONS

Wikipedia.org. "Hydride." Apr. 18, 2016.
Wikipedia.org. "Getter." Apr. 27, 2016.

*Primary Examiner* — Marcos D Pizarro
*Assistant Examiner* — Nelson Garces
(74) *Attorney, Agent, or Firm* — Eschweiler & Potashnik, LLC

(57) ABSTRACT

A microelectromechanical systems (MEMS) package with high gettering efficiency is provided. A MEMS device is arranged over a logic chip, within a cavity that is hermetically sealed. A sensing electrode is arranged within the cavity, between the MEMS device and the logic chip. The sensing electrode is electrically coupled to the logic chip and is a conductive getter material configured to remove gas molecules from the cavity. A method for manufacturing the MEMS package is also provided.

20 Claims, 8 Drawing Sheets

(51) Int. Cl.
  *B81B 3/00*    (2006.01)
  *H01L 23/02*   (2006.01)
  *H01L 21/54*   (2006.01)
  *H01L 21/322*  (2006.01)
  *H01L 23/26*   (2006.01)
  *H01L 29/84*   (2006.01)
  *H01L 21/50*   (2006.01)

(52) U.S. Cl.
  CPC ... *B81B 2201/0242* (2013.01); *B81B 2203/04* (2013.01); *B81B 2207/07* (2013.01); *B81C 2201/013* (2013.01); *B81C 2201/016* (2013.01); *B81C 2203/0109* (2013.01); *B81C 2203/0714* (2013.01)

(58) Field of Classification Search
  USPC .................................................. 257/410–420
  See application file for complete search history.

(56) References Cited

U.S. PATENT DOCUMENTS

| | | | |
|---|---|---|---|
| 9,065,358 B2 | 6/2015 | Tsai et al. | |
| 9,085,455 B2 | 7/2015 | Cheng et al. | |
| 9,085,456 B2 | 7/2015 | Tsai et al. | |
| 9,122,827 B2 | 9/2015 | Chen et al. | |
| 9,133,017 B2 | 9/2015 | Liang et al. | |
| 9,138,994 B2 | 9/2015 | Peng et al. | |
| 9,139,420 B2 | 9/2015 | Chang et al. | |
| 9,139,423 B2 | 9/2015 | Chien et al. | |
| 9,181,083 B2 | 11/2015 | Tsai et al. | |
| 9,187,317 B2 | 11/2015 | Cheng et al. | |
| 9,233,839 B2 | 1/2016 | Liu et al. | |
| 9,236,877 B2 | 1/2016 | Peng et al. | |
| 9,238,581 B2 | 1/2016 | Wu et al. | |
| 2014/0030847 A1* | 1/2014 | Kotlanka | H01L 21/50 438/107 |
| 2014/0287548 A1 | 9/2014 | Lin et al. | |
| 2015/0014854 A1* | 1/2015 | Gooch | H01L 23/49866 257/751 |
| 2015/0035089 A1* | 2/2015 | Liu | B81B 7/02 257/415 |
| 2015/0102432 A1 | 4/2015 | Hsieh et al. | |
| 2015/0137303 A1 | 5/2015 | Chou et al. | |
| 2015/0175405 A1 | 6/2015 | Cheng | |
| 2015/0175407 A1 | 6/2015 | Cheng et al. | |
| 2015/0196912 A1 | 7/2015 | Tsai et al. | |
| 2015/0214164 A1* | 7/2015 | Matocha | H01L 29/7811 257/77 |
| 2016/0221819 A1* | 8/2016 | Smeys | B81B 7/0041 |

\* cited by examiner

GETTER ELECTRODE TO IMPROVE VACUUM LEVEL IN A MICROELECTROMECHANICAL SYSTEMS (MEMS) DEVICE

REFERENCE TO RELATED APPLICATION

This application claims the benefit of U.S. Provisional Application No. 62/322,263, filed on Apr. 14, 2016, the contents of which are incorporated by reference in their entirety.

BACKGROUND

In the past decade, microelectromechanical system (MEMS) devices have become increasingly common in electronic devices (e.g., cell phones, sensors, etc.). MEMS devices include mechanical and electrical features that are able to that sense physical forces or quantities (e.g., acceleration, radiation, etc.) and/or control physical quantities (e.g., fluids). Examples of MEMS devices include microsensors, which convert mechanical signals into electrical signals, and micro-actuators, which convert electrical signals into mechanical signals.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
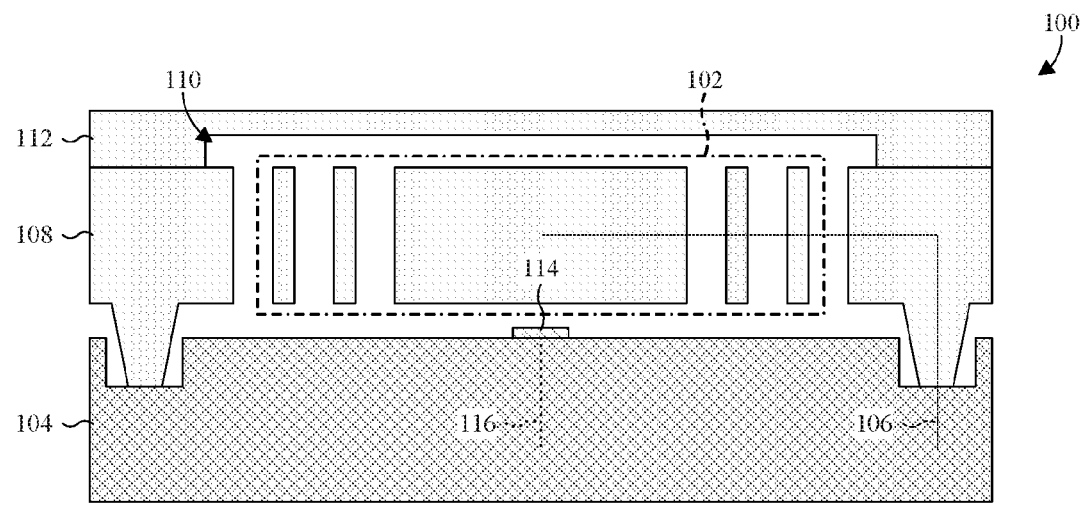
FIG. 1 illustrates a cross-sectional view of some embodiments of a microelectromechanical systems (MEMS) package with high gettering efficiency.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some microelectromechanical systems (MEMS) packages comprise a MEMS substrate arranged over a logic chip and covered by a cap substrate. The MEMS substrate comprises a MEMS device arranged within a cavity defined between the logic chip and the cap substrate. The cavity protects the MEMS device and is hermetically sealed with a pressure selected to enhance performance of the MEMS device. For example, where the MEMS device is a vibrational gyroscope, a low pressure mitigates background noise to improve sensitivity. The logic chip is configured to electrically sense motion of the MEMS device using sensing electrodes arranged in the cavity, along a bottom surface of the cavity. The cap substrate comprises a recess in a bottom thereof that partially defines a top of the cavity, and further comprises a getter layer that is arranged in the recess, separate from the sensing electrodes.

The getter layer is configured to react with and/or absorb gas molecules in the cavity to remove the gas molecules from the cavity. Such gas molecules may, for example, diffuse into the cavity from surrounding layers over time and/or may be trapped within the cavity at the time of sealing the cavity. Removing the gas molecules advantageously reduces a pressure within the cavity and may improve the performance of the MEMS device. For example, where the MEMS device is a vibrational gyroscope, removing the gas molecules may decrease the pressure to improve sensitivity. However, while the getter layer may reduce the pressure and improve the performance of the MEMS device, an efficiency of the getter layer may be too low to achieve optimal performance for the MEMS device.

The present application is directed towards a MEMS package for high efficiency gettering to remove gas molecules from a cavity of the MEMS package. In some embodiments, a MEMS device is arranged over a logic chip and within a cavity that is hermetically sealed. A sensing electrode is arranged within the cavity, between the MEMS device and the logic chip. The sensing electrode is electrically coupled to the logic chip and is a conductive getter material configured to remove gas molecules from the cavity. Since the sensing electrode is a conductive getter material, the sensing electrode may also be referred to as a getter electrode. Advantageously, using the conductive getter material for the sensing electrode may allow a separate getter layer to be omitted, thereby reducing costs and increasing throughput during bulk manufacture. Further, using the conductive getter material for the sensing electrode may advantageously achieve better gettering efficiency than if a non-getter material was used for the sensing electrode. This, in turn, may improve performance of the MEMS device.

With reference to FIG. 1, a cross-sectional view 100 of some embodiments of a MEMS package with high gettering efficiency is provided. As illustrated, a MEMS device 102 is arranged over and electrically coupled to a logic chip 104. For ease of illustration, a dashed line 106 is employed to represent such electrical coupling. The MEMS device 102 is defined within a MEMS substrate 108 that is arranged over and bonded to the logic chip 104, and is electrically coupled to the logic chip 104 along a periphery of the MEMS substrate 108. The MEMS device 102 is configured to move within a cavity 110 in response to external stimuli, such as, for example, acceleration or motion, and may be, for example, a gyroscope, an accelerometer, or more generally a motion sensor. The cavity 110 is hermetically sealed and, in some embodiments, is defined between the logic chip 104 and a cap substrate 112 covering the MEMS device 102. A pressure of the cavity 110 may, for example, be selected to enhance performance of the MEMS device 102.

The logic chip 104 is configured to measure or sense movement of the MEMS device 102 using capacitive coupling between the MEMS device 102 and a sensing electrode 114. The sensing electrode 114 is arranged along a top surface of the logic chip 104, directly under the MEMS device 102, and is electrically coupled with the logic chip 104. For ease of illustration, a dotted line 116 is employed to represent such electrical coupling. Further, the sensing electrode 114 is a conductive getter material, such that the sensing electrode 114 removes gas molecules from the cavity 110 and lowers a pressure of the cavity 110. The gas molecules may, for example, diffuse into the cavity 110 from surrounding layers over time and/or may be trapped within the cavity 110 at the time of sealing the cavity 110. The conductive getter material is a material configured to react with and/or absorb the gas molecules from the cavity 110 and may be, for example, titanium tungsten or some other titanium alloy.

Advantageously, using the conductive getter material for the sensing electrode 114 may allow a separate getter layer to be omitted from the cavity 110. This, in turn, may reduce costs and increase throughput during bulk manufacture since the processing steps for the separate getter layer may be omitted. Further, using the conductive getter material for the sensing electrode 114 may advantageously achieve better gettering efficiency than if a non-getter material was used for the sensing electrode 114. For example, it was found through experimentation that using the conductive getter material for the sensing electrode 114 may advantageously reduce the pressure of the cavity 110 by 35% more than if the non-getter material was used for the sensing electrode 114. This, in turn, may improve performance and/or sensitivity of the MEMS device. Even more, it was unexpectedly found through experimentation that using titanium tungsten for the sensing electrode 114 may provide better gettering performance than if elemental or pure titanium was used for the sensing electrode 114.

Figure 2:
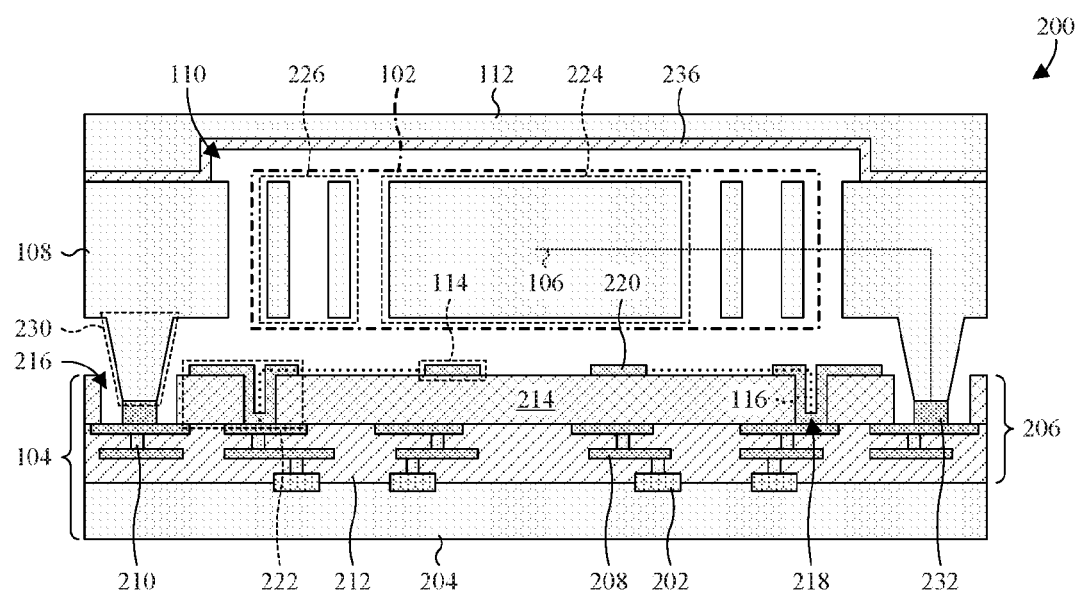
FIG. 2 illustrates a cross-sectional view of some more detailed embodiments of the MEMS package of FIG. 1.

With reference to FIG. 2, a cross-sectional view 200 of some more detailed embodiments of the MEMS package of FIG. 1 is provided. As illustrated, a logic chip 104 comprises a plurality of electronic devices 202 arranged over a logic substrate 204 and covered by an interconnect structure 206. The electronic devices 202 are configured to sense or measure motion of a MEMS device 102 arranged thereover and may be, for example, complementary metal-oxide-semiconductor (CMOS) devices, such as CMOS transistors or CMOS memory cells. The logic substrate 204 may be, for example, a bulk semiconductor substrate, such as a bulk mono-crystalline silicon substrate, or a silicon-on-insulator (SOI) substrate.

The interconnect structure 206 comprises interconnect layers 208 and via layers 210 alternatingly stacked within an interlayer dielectric (ILD) region 212 that is covered by a passivation layer 214. For ease of illustration, only two interconnect layers and two via layers are shown, but more or less interconnect layers and via layers are amenable. The interconnect layers 208 electrically couple neighboring via layers together and each comprise a plurality of features, such as, for example, line-shaped features and/or pad features. The via layers 210 electrically couple neighboring conductive layers together, and further electrically couple a bottom one of the interconnect layers 208 to the electronic devices 202. Further, the via layers 210 each comprise a plurality of vias. The interconnect layers 208 and the via layers 210 may be, for example, copper, aluminum copper, tungsten, or a combination of the foregoing.

The ILD region 212 and the passivation layer 214 are stacked upon one another, with the passivation layer 214 covering the ILD region 212, and may be, for example, silicon dioxide, silicon nitride, a low κ dielectric, or a combination of the foregoing. A low-κ dielectric is a dielectric with a dielectric constant κ less than about 3.9. Further, the passivation layer 214 comprises a plurality of openings 216, 218 extending therethrough to expose a top one of the interconnect layers 208. The openings 216, 218 comprise a peripheral opening 216 extending laterally along a periphery of the logic chip 104 to laterally enclose a cavity 110 hermetically sealed over the logic chip 104. Further, the openings 216, 218 comprise via openings 218 arranged within the cavity 110 and accommodating a getter layer 220.

The getter layer 220 is arranged over the passivation layer 214, within the cavity 110, and comprises getter vias 222 and sensing electrodes 114. The getter layer 220 is a conductive getter material, such that the getter layer 220 absorbs and/or reacts with gas molecules in the cavity 110 to remove the gas molecules from the cavity 110. The gas molecules may be, for example, hydrogen, oxygen, or nitrogen. Further, the gas molecules may, for example, diffuse into the cavity 110 over time from surrounding layers and/or may be trapped within the cavity 110 at the time of sealing the cavity 110. In some embodiments, the conductive getter material is titanium tungsten, some other titanium alloy, palladium hydride, or some other metal hydride. Further, in other embodiments, the conductive getter material comprises palladium, vanadium, iron, cobalt, titanium, barium, hafnium, zirconium, aluminum, or silicon.

The getter vias 222 are arranged in the via openings 218, and electrically couple the top one of the interconnect layers 208 to the sensing electrodes 114. For ease of illustration, dotted lines 116 are employed to represent such electrical coupling. In some embodiments, the getter vias 222 are electrically coupled to the sensing electrodes 114 by line-shaped features (not shown) of the getter layer 220 that extend laterally from the getter vias 222 to the sensing electrodes 114. The sensing electrodes 114 are arranged directly under the MEMS device 102, such that the sensing electrodes 114 are capacitively coupled to the MEMS device 102. Further, the sensing electrodes 114 are electrically coupled to the electronic devices 202 through the top one of the interconnect layers 208, such that the sensing electrodes 114 may be used by the electronic devices 202 to sense or measure motion of the MEMS device 102.

The MEMS device 102 is arranged within the cavity 110 and comprises a proof mass 224. The proof mass 224 is suspended within the cavity 110 by springs 226 and/or cantilever beams extending laterally between the proof mass 224 and sidewalls of the cavity 110. Further, the proof mass 224 is configured to move within the cavity 110 in response to external stimuli, and is or otherwise comprises a movable electrode. The movable electrode is capacitively coupled to the sensing electrodes 114, and is electrically coupled to the logic chip 104 along a periphery of a MEMS substrate 108 within which the MEMS device 102 is defined. For ease of illustration, a dashed line 106 is employed to represent such electrical coupling. By measuring the extent of the capacitive coupling between the movable electrode and the sensing electrodes 114, the extent of the external stimuli can be measured.

The MEMS substrate 108 is arranged over and bonded to the logic chip 104, and supports a cap substrate 112. In some embodiments, the MEMS substrate 108 is or otherwise comprises a bulk semiconductor substrate, such as a bulk monocrystalline silicon substrate, or a SOI substrate. Further, in some embodiments, the MEMS substrate 108 is or otherwise comprises an epitaxial layer, a polysilicon layer, a dielectric layer, or a multi-layer stack comprising a combination of the foregoing. Even more, in some embodiments, the MEMS substrate 108 comprises a protrusion 230 that extends downward and that is arranged along a bottom of the MEMS substrate 108.

The protrusion 230 is arranged in the peripheral opening 216 of the passivation layer 214, and extends laterally to enclose the cavity 110. Further, the protrusion 230 bonds and electrically couples the MEMS substrate 108 to the logic chip 104. In some embodiments, the protrusion 230 eutectically bonds to the MEMS substrate 108 through a eutectic bond layer 232 arranged along a bottom surface of the protrusion 230, between the top one of the interconnect layers 208 and the bottom surface of the protrusion 230. The eutectic bond layer 232 may be, for example, germanium or some other eutectic bonding material.

The cap substrate 112 is arranged over and bonded to the MEMS substrate 108 to define a top of the cavity 110, and may be or otherwise comprise, for example, a bulk semiconductor substrate or a SOI substrate. The cap substrate 112 comprises a recess on a bottom thereof. The recess is arranged directly over the cavity 110, and extends laterally from a first side of the cavity 110 to a second side of the cavity 110 opposite the first side. In some embodiments, the cap substrate 112 is bonded to the MEMS substrate 108 through a fusion bond layer 236 lining the bottom of the cap substrate 112. The fusion bond layer 236 may be, for example, silicon dioxide or some other dielectric.

In operation, the proof mass 224 moves within the cavity 110 in proportion to external stimuli. For example, as the MEMS package is accelerated, the proof mass 224 moves within the cavity 110 in proportion to the acceleration. Capacitive coupling between the sensing electrodes 114 and the movable electrode (not shown) of the proof mass 224 is then used by the logic chip 104 to measure the movement of the proof mass 224 and to indirectly measure the external stimuli. The accuracy of such measurements may vary depending upon the pressure of the cavity 110, such that the pressure of the cavity 110 may be selected to optimize performance. For example, where the MEMS device 102 is a vibrational gyroscope, the pressure may be low to reduce background noise and increase sensitivity.

The getter layer 220 lowers the pressure of the cavity 110, which may enhance performance and/or sensitivity of the MEMS device 102. Further, it was found through experimentation that forming the sensing electrodes 114 within the getter layer 220, such that the getter layer 220 is electrically coupled to the logic chip 104, may improve gettering efficiency compared to non-getter sensing electrodes. For example, during experimentation, the getter layer 220 with the sensing electrodes 114 lowered the pressure of the cavity 110 by 35% more than non-getter sensing electrodes.

While the MEMS device 102 of FIGS. 1 and 2 was illustrated with a structure comprising the proof mass 224 and the springs 226, the MEMS device 102 may have other structures with or without the proof mass 224 and/or the springs 226. Further, while the MEMS package of FIGS. 1 and 2 was illustrated with a structure comprising the logic chip 104, the MEMS substrate 108, and the cap substrate 112, the MEMS package may have other structures with or without the cap substrate 112. For example, the MEMS device 102 may be a pressure sensor, such that the cap substrate 112 is omitted and the MEMS device 102 comprises a flexible membrane defining a top of the cavity 110. The flexible membrane may be, or otherwise comprise, for example, the movable electrode. Even more, while the MEMS package was illustrated and described as comprising multiple sensing electrodes 114, the MEMS package may only have a single sensing electrode.

With reference to FIGS. 3-15, a series of cross-sectional views 300-1500 of some embodiments of a method for manufacturing a MEMS package with high gettering efficiency is provided. The MEMS package may, for example, be configured as described in FIG. 2.

Figure 3:
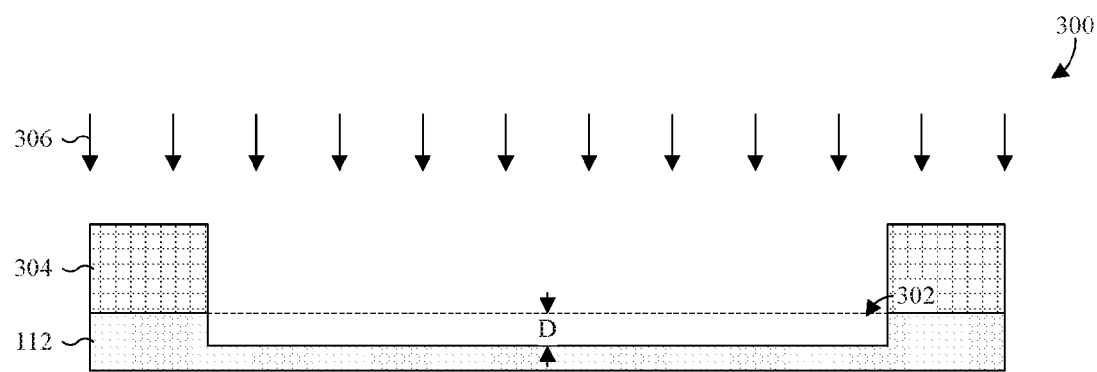
FIGS. 3-15 illustrate a series of cross-sectional views of some embodiments of a method for manufacturing a MEMS package with high gettering efficiency.

As illustrated by the cross-sectional view 300 of FIG. 3, a first etch is performed into a cap substrate 112 to form a recess 302 with a depth D in the cap substrate 112. In some embodiments, the process for performing the first etch comprises depositing and patterning a first photoresist layer 304, such that the first photoresist layer 304 laterally surrounds a region of the cap substrate 112 that corresponds to the recess 302. Further, in some embodiments, the process comprises applying one or more first etchants 306 to the cap substrate 112 with the first photoresist layer 304 in place, and subsequently stripping the first photoresist layer 304.

Figure 4:
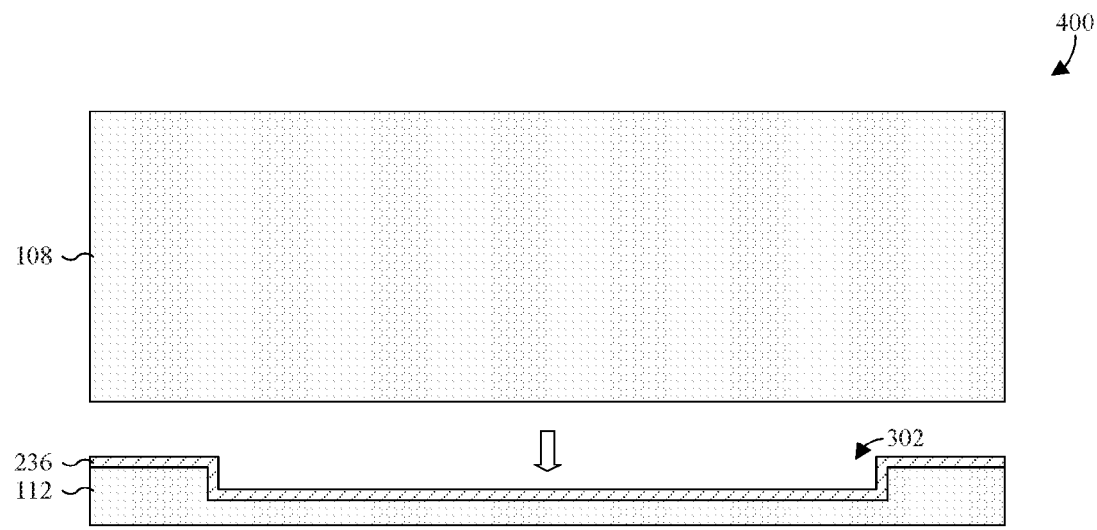

As illustrated by the cross-sectional view 400 of FIG. 4, a fusion bond layer 236 is formed lining the side of the cap substrate 112 on which the recess 302 is arranged. Further, the fusion bond layer 236 is formed of a dielectric, such as silicon dioxide. In some embodiments, the process for forming the fusion bond layer 236 comprises conformally depositing or otherwise growing the fusion bond layer 236. The fusion bond layer 236 may, for example, be deposited by vapor deposition, such as chemical vapor deposition (CVD) or physical vapor deposition (PVD). Further, the fusion bond layer 236 may, for example, be grown by thermal oxidation.

Also illustrated by the cross-sectional view 400 of FIG. 4, a fusion bonding process is performed to bond the cap substrate 112 to a MEMS substrate 108. Further, the fusion bonding process bonds the cap substrate 112 to the MEMS substrate 108 through the fusion bond layer 236, and seals the recess 302. In some embodiments, the fusion bonding process comprises applying water to a surface of the fusion bonding layer 236 or a surface of the MEMS substrate 108, placing the surfaces in contact, and annealing.

Figure 5:
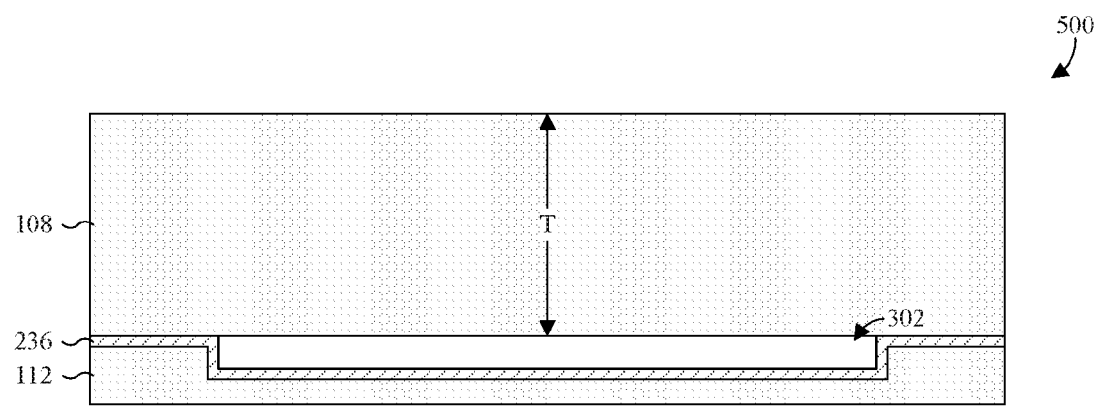

As illustrated by the cross-sectional view 500 of FIG. 5, the MEMS substrate 108 is thinned to a desired thickness T. In some embodiments, the thinning process comprises a planarization into the MEMS substrate 108. The planarization may be, for example, a chemical mechanical polish (CMP).

Figure 6:
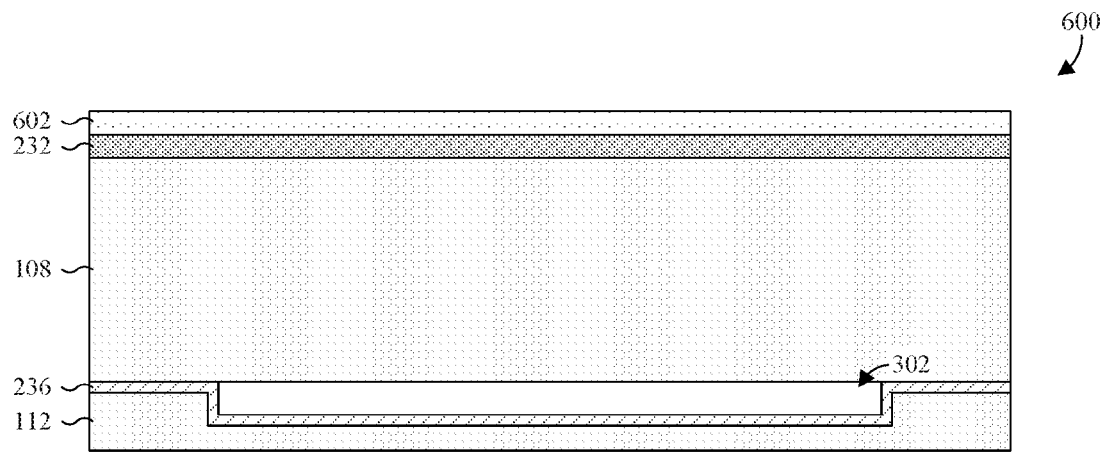

As illustrated by the cross-sectional view 600 of FIG. 6, a eutectic bond layer 232 is formed over the MEMS substrate 108, and a hard mask layer 602 is formed over the eutectic bond layer 232. The eutectic bond layer 232 may, for example, be formed of germanium, and/or the hard mask layer 602 may, for example, be formed of silicon nitride or silicon dioxide. In some embodiments, the process for forming eutectic bond layer 232 and the hard mask layer 602 comprises depositing or growing the eutectic bond layer 232 over the MEMS substrate 108, and subsequently depositing or growing the hard mask layer 602 over the eutectic bond layer 232. The eutectic bond layer 232 and the hard mask layer 602 may be deposited or grown by, for example, vapor deposition, thermal oxidation, or a combination of the foregoing.

Figure 7:
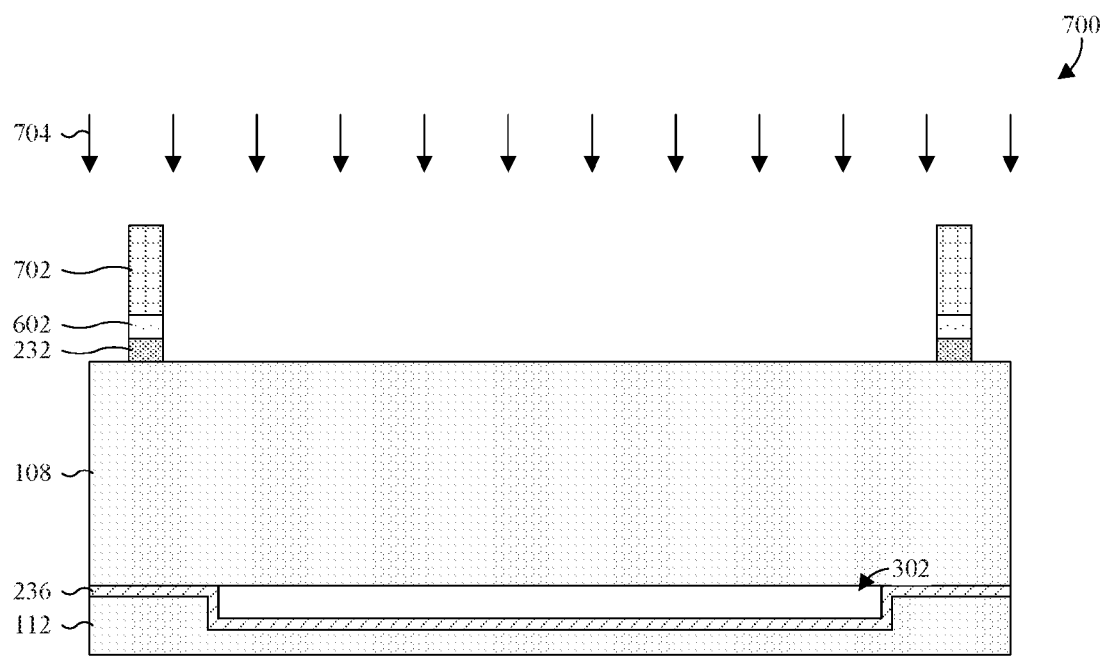

As illustrated by the cross-sectional view 700 of FIG. 7, a second etch is performed into the eutectic bond layer 232 and the hard mask layer 602 to remove an interior region and a peripheral region, such that the eutectic bond layer 232 and the hard mask layer 602 extend laterally to enclose the interior region. For example, the second etch may pattern the eutectic bond layer 232 and the hard mask layer 602 with a ring shape. In some embodiments, the process for performing the second etch comprises depositing and patterning a second photoresist layer 702. Further, in some embodiments, the process comprises applying one or more second etchants 704 to the MEMS substrate 108 with the second photoresist layer 702 in place, and subsequently stripping the second photoresist layer 702.

Figure 8:
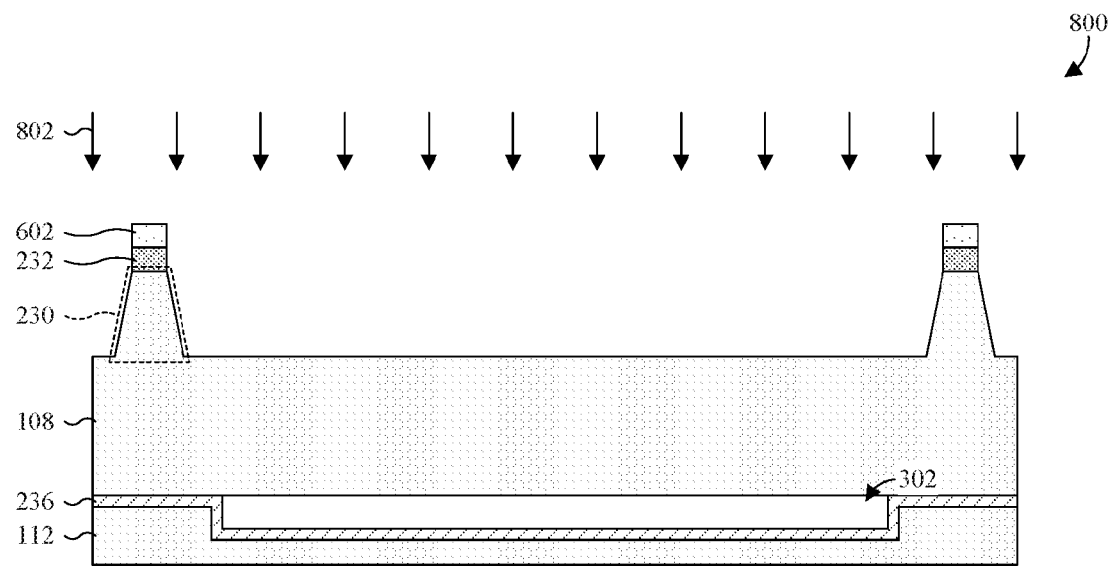

As illustrated by the cross-sectional view 800 of FIG. 8, a third etch is performed into the MEMS substrate 108 using the hard mask layer 602 as a mask. The third etch results in a protrusion 230 extending upward from a bulk of the MEMS substrate 108, and extending laterally to enclose an interior region. In some embodiments, the process for performing the third etch comprises applying one or more third etchants 802 to the MEMS substrate 108 with the hard mask layer 602 in place, and subsequently stripping the hard mask layer 602.

Figure 9:
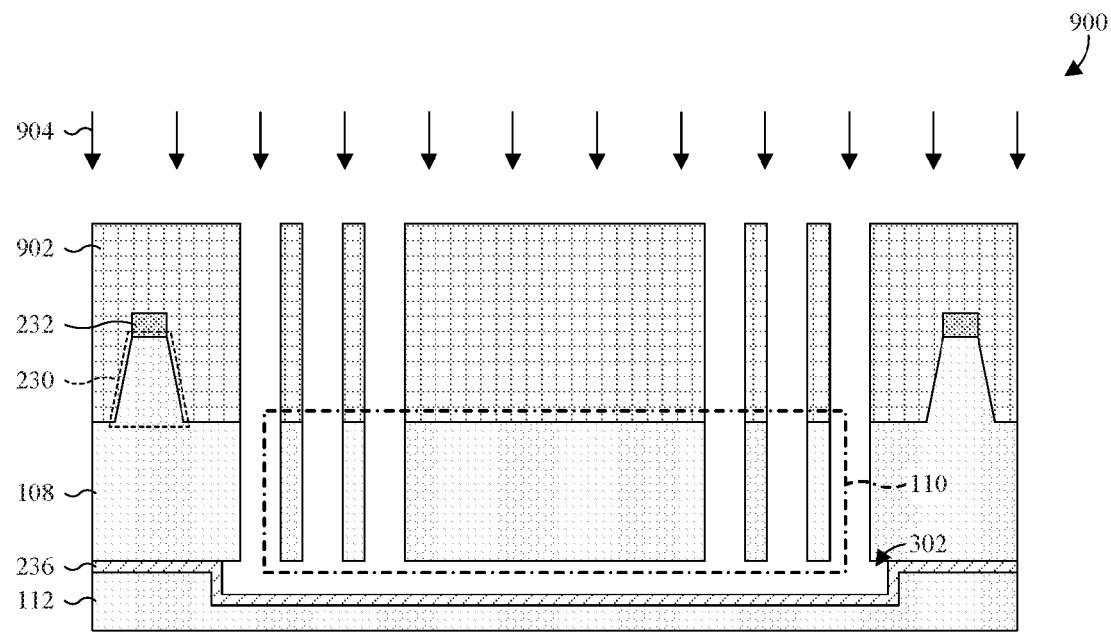

As illustrated by the cross-sectional view 900 of FIG. 9, a fourth etch is performed into the MEMS substrate 108 to form a MEMS device 102 immediately over the recess 302. The fourth etch may extend, for example, through the MEMS substrate 108 so as to open the recess 302. In some embodiments, the process for performing the fourth etch comprises depositing and patterning a third photoresist layer 902. Further, in some embodiments, the process comprises applying one or more fourth etchants 904 to the MEMS substrate 108 with the third photoresist layer 902 in place, and subsequently stripping the third photoresist layer 902.

Figure 10:
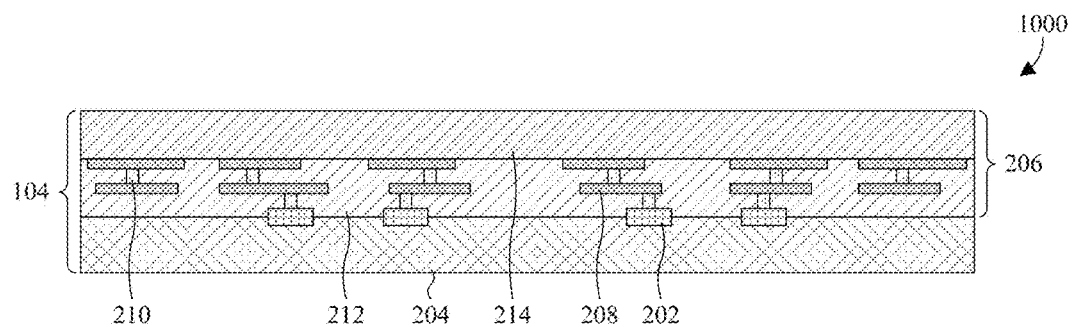

As illustrated by the cross-sectional view 1000 of FIG. 10, a logic chip 104 is formed. In some embodiments, the process for forming the logic chip 104 comprises forming a plurality of electronic devices 202 over a logic substrate 204. Further, in some embodiments, the process comprises forming an interconnect structure 206 covering the electronic devices 202. The interconnect structure 206 is formed with interconnect layers 208 and via layers 210 alternatingly stacked within an interlayer dielectric (ILD) region 212 that is covered by a passivation layer 214. For ease of illustration, only two interconnect layers 208 and two via layers 210 are shown, but more or less interconnect layers and via layers are amenable in other embodiments. The electronic devices 202 and the interconnect structure 206 may be formed using, for example, CMOS manufacturing processes.

Figure 11:
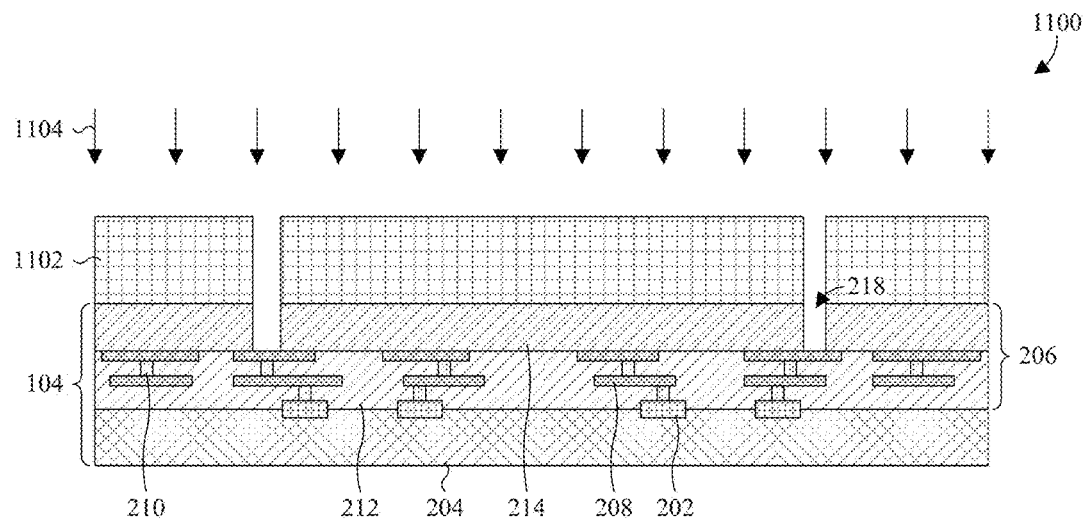

As illustrated by the cross-sectional view 1100 of FIG. 11, a fifth etch is performed into the passivation layer 214 to form via openings 218 exposing a top one of the interconnect layers 208. In some embodiments, the process for performing the fifth etch comprises depositing and patterning a fourth photoresist layer 1102, such that the fourth photoresist layer 1102 laterally surrounds a region of the passivation layer 214 that corresponds to the via openings 218. Further, in some embodiments, the process comprises applying one or more fifth etchants 1104 to the passivation layer 214 with the fourth photoresist layer 1102 in place, and subsequently stripping the fourth photoresist layer 1102.

Figure 12:
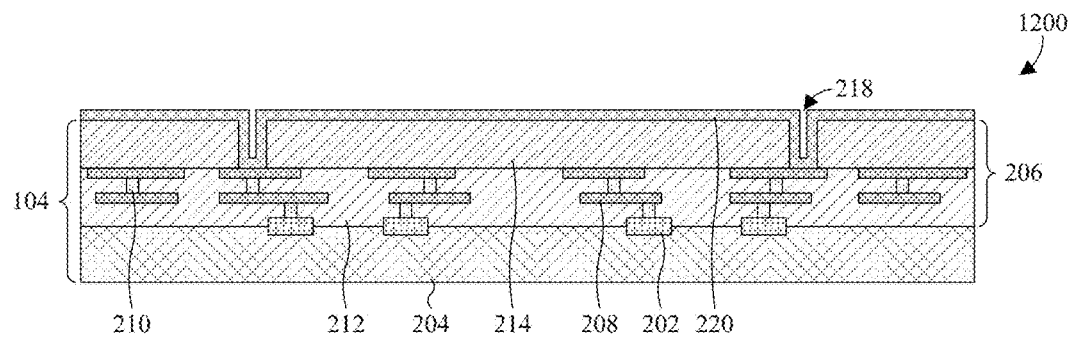

As illustrated by the cross-sectional view 1200 of FIG. 12, a getter layer 220 is formed lining a top of the passivation layer 214 and the via openings 218. Further, the getter layer 220 is formed of a conductive getter material configured to absorb gas molecules, such as titanium tungsten or some other titanium alloy. In some embodiments, the process for forming the getter layer 220 comprises conformally depositing or otherwise growing the getter layer 220. The getter layer 220 may, for example, be deposited by vapor deposition, such as CVD or PVD.

Figure 13:
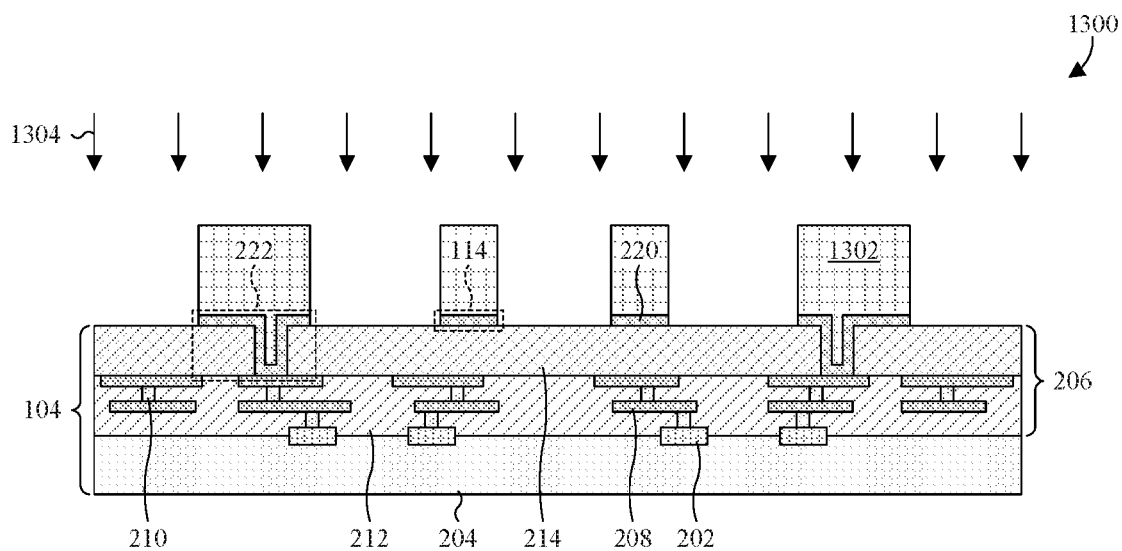

As illustrated by the cross-sectional view 1300 of FIG. 13, a sixth etch is performed into the getter layer 220 to form sensing electrodes 114 and getter vias 222 electrically coupling the sensing electrodes 114 to the top one of the interconnect layers 208. The sixth etch may also, for example, form line-shaped features (not shown) extending laterally from the getter vias 222 to the sensing electrodes 114. In some embodiments, the process for performing the sixth etch comprises depositing and patterning a fifth photoresist layer 1302, such that the fifth photoresist layer 1302 masks regions of the getter layer 220 corresponding to the getter vias 222 and the sensing electrodes 114. Further, in some embodiments, the process comprises applying one or more sixth etchants 1304 to the getter layer 220 with the fifth photoresist layer 1302 in place, and subsequently stripping the fifth photoresist layer 1302.

Figure 14:
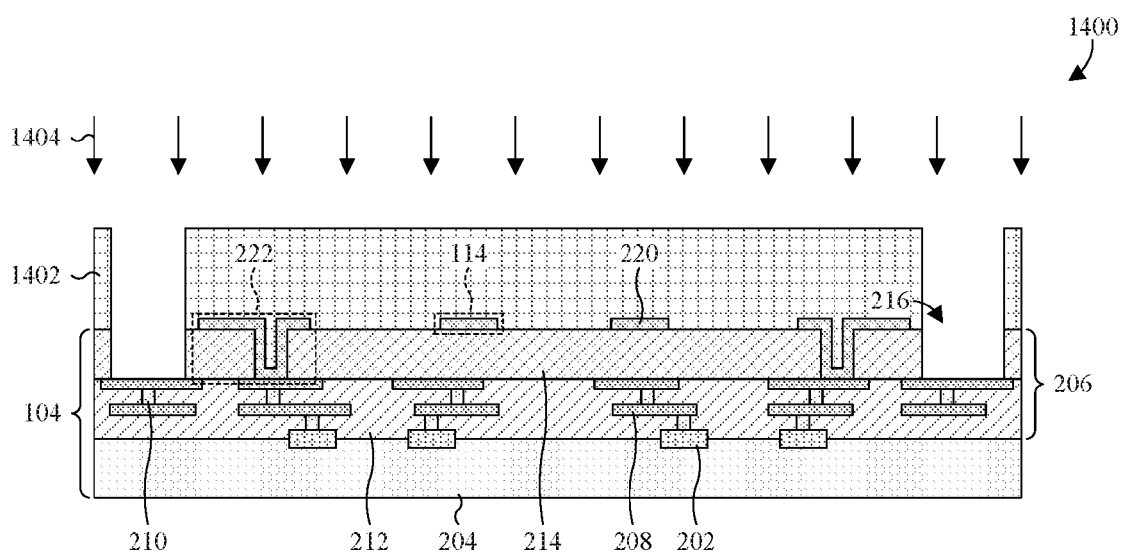

As illustrated by the cross-sectional view 1400 of FIG. 14, a seventh etch is performed into the passivation layer 214 to form a peripheral opening 216 exposing the top one of the interconnect layers 208 and extending laterally to enclose the sensing electrodes 114 and the getter vias 222. In some embodiments, the process for performing the seventh etch comprises depositing and patterning a sixth photoresist layer 1402, such that the sixth photoresist layer 1402 laterally surrounds a region of the passivation layer 214 corresponding to the peripheral opening 216. Further, in some embodiments, the process comprises applying one or more seventh etchants 1404 to the passivation layer 214 with the sixth photoresist layer 1402 in place, and subsequently stripping the sixth photoresist layer 1402.

Figure 15:
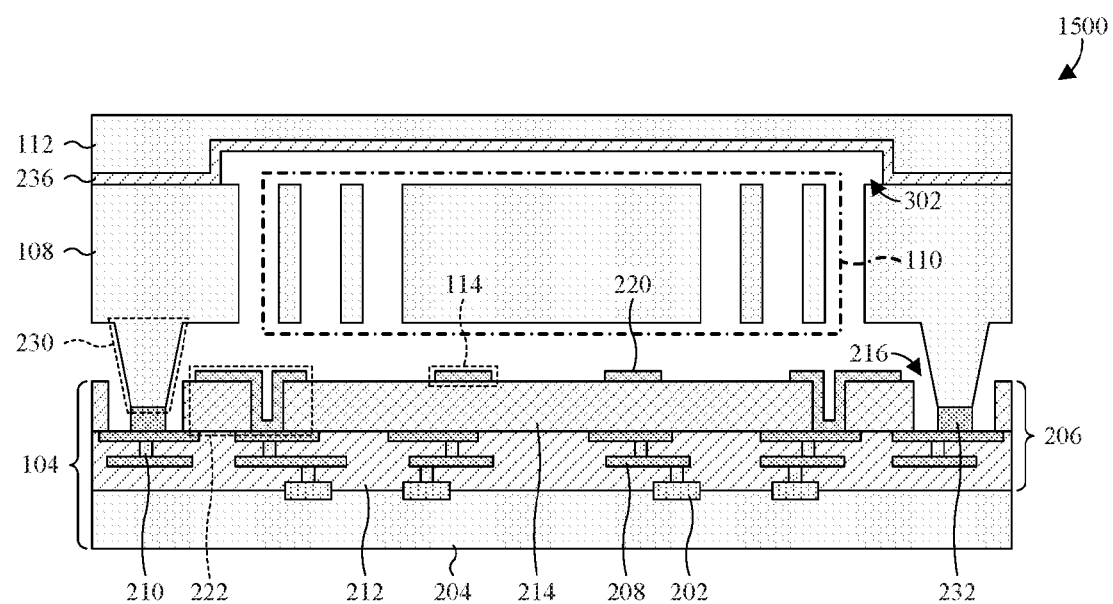

As illustrated by the cross-sectional view 1500 of FIG. 15, the logic chip 104 is eutectically bonded to the MEMS substrate 108 through the eutectic bond layer 232 and the peripheral opening 216. In some embodiments, the eutectic bonding process comprises pressing the eutectic bond layer 232 against the top one of the interconnect layers 208, and subsequently heating the eutectic bond layer 232 and the top one of the interconnect layers 208.

While details regarding the formation and patterning of photoresist layers, such as the first photoresist layer 304 of FIG. 3, were omitted above, the photoresist layers may be deposited by, for example, spin coating or vapor deposition, and/or may be patterned by, for example, photolithography. Similarly, while details regarding the stripping of the photoresist layers were omitted above, the photoresist layers may be stripped by, for example, a wet strip process using a sulfuric acid-hydrogen peroxide mixture (SPM).

Figure 16:
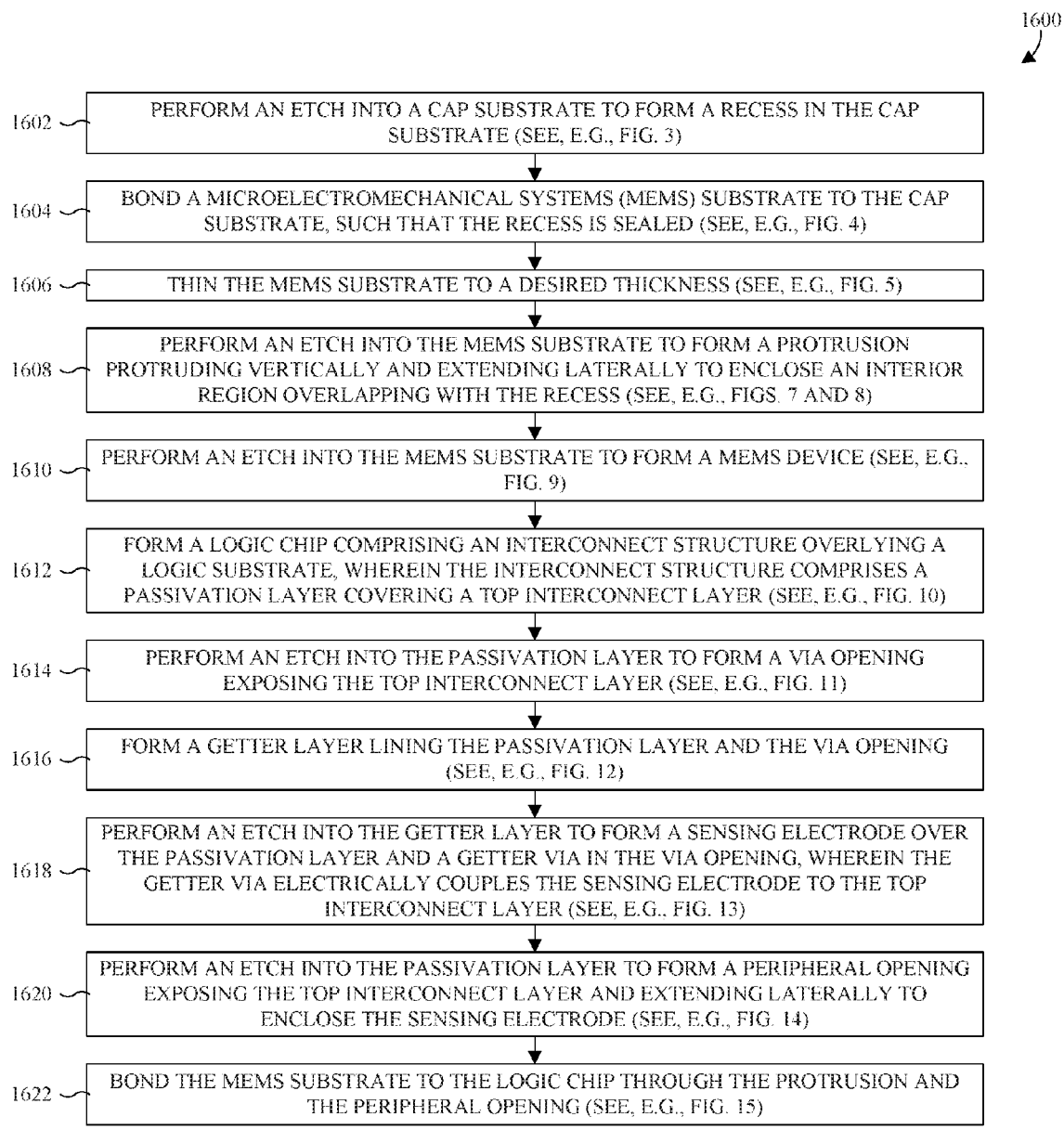
FIG. 16 illustrates a flowchart of some embodiments of the method of FIGS. 3-15.

With reference to FIG. 16, a flowchart 1600 of some embodiments of the method of FIGS. 3-15 is provided.

At 1602, an etch is performed into a cap substrate to form a recess in the cap substrate. See, for example, FIG. 3.

At 1604, a MEMS substrate is bonded to the cap substrate, such that the recess is sealed. See, for example, FIG. 4.

At 1606, the MEMS substrate is thinned to a desired thickness. See, for example, FIG. 5.

At 1608, an etch is performed into the MEMS substrate to form a protrusion protruding vertically and extending laterally to enclose an interior region overlapping with the recess. See, for example, FIGS. 7 and 8.

At 1610, an etch is performed into the MEMS substrate to form a MEMS device. See, for example, FIG. 9.

At 1612, a logic chip is formed comprising an interconnect structure overlying a logic substrate, wherein the interconnect structure comprises a passivation layer covering a top interconnect layer. See, for example, FIG. 10.

At 1614, an etch is performed into the passivation layer to form a via opening exposing the top interconnect layer. See, for example, FIG. 11.

At 1616, a getter layer is formed lining the passivation layer and the via opening. See, for example, FIG. 12.

At 1618, an etch is performed into the getter layer to form a sensing electrode over the passivation layer and a getter via in the via opening, wherein the getter via electrically couples the sensing electrode to the top interconnect layer. See, for example, FIG. 13.

At 1620, an etch is performed into the passivation layer to form a peripheral opening exposing the top interconnect layer and extending laterally to enclose the sensing electrode. See, for example, FIG. 14.

At 1622, the MEMS substrate is bonded to the logic chip through the protrusion and the peripheral opening. See, for example, FIG. 15.

While the method described by the flowchart 1600 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In view of the foregoing, in some embodiments, the present disclosure provides a MEMS package. A MEMS device is arranged over a logic chip, within a cavity that is hermetically sealed. A sensing electrode is arranged within the cavity, between the MEMS device and the logic chip. The sensing electrode is electrically coupled to the logic chip and is a conductive getter material configured to remove gas molecules from the cavity.

In other embodiments, the present disclosure provides a method for manufacturing a MEMS package. A getter layer is formed over and electrically coupled to a logic chip. The getter layer is formed of a conductive getter material configured to remove gas molecules from a surrounding environment. An etch is performed into the getter layer to define a sensing electrode. A MEMS substrate is bonded to the logic chip, such that a MEMS device of the MEMS substrate is arranged over the sensing electrode.

In yet other embodiments, the present disclosure provides another MEMS package. A logic chip comprises CMOS devices arranged over a logic substrate and covered by an interconnect structure. The interconnect structure comprises a passivation layer covering a top interconnect layer that is electrically coupled with the CMOS devices. A cap substrate is arranged over the logic chip. The cap substrate comprises a recess along a bottom of the cap substrate. A MEMS substrate is arranged over the logic chip and is covered by the cap substrate. The MEMS substrate comprises a MEMS device configured to move within a cavity that is hermetically sealed. A top of the cavity and a bottom of the cavity are respectively defined by the cap substrate and the logic chip. A getter layer is arranged in the cavity, between the MEMS device and the logic chip. The getter layer comprises a sensing electrode arranged over the passivation layer, and further comprises a getter via extending through the passivation layer to electrically couple the sensing electrode to the top interconnect layer. Further, the getter layer is a conductive getter material configured to remove gas molecules from the cavity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a microelectromechanical systems (MEMS) package, the method comprising:
   forming a logic chip, wherein forming the logic chip comprises: forming complementary metal-oxide-semiconductor (CMOS) devices over a logic substrate; and forming an interconnect structure over the CMOS devices, wherein the interconnect structure is formed with an alternating stack of interconnect layers and via layers;
   performing an etch through a passivation layer of the logic chip to form a via opening exposing a top interconnect layer, wherein the top interconnect layer is a top one of the interconnect layers;
   forming a via extending through the passivation layer of the logic chip to the top interconnect layer of the logic chip;
   forming a getter layer over the logic chip and the passivation layer, and electrically coupled to the logic chip, wherein the getter layer is formed of a conductive getter material configured to remove gas molecules from a surrounding environment, and wherein the getter layer is formed lining the via opening;
   performing a second etch into the getter layer to define a sensing electrode electrically coupled to the top interconnect layer by the via, wherein the second etch further defines the via from the getter layer; and
   bonding a MEMS substrate to the logic chip, such that a MEMS device of the MEMS substrate is arranged over the sensing electrode.

2. The method according to claim 1, further comprising: forming the getter layer of titanium tungsten.

3. The method according to claim 1, further comprising: forming the getter layer of a titanium alloy.

4. The method according to claim 1, further comprising:
   performing a third etch into a cap substrate to form a recess in the cap substrate;
   bonding the cap substrate to the MEMS substrate, such that the recess is sealed; and
   performing a fourth etch into the MEMS substrate to form the MEMS device in the MEMS substrate and to open the recess.

5. The method according to claim 1, further comprising:
   performing a third etch into the MEMS substrate to form a protrusion protruding vertically and extending laterally to enclose a first interior region, wherein the MEMS substrate comprises the MEMS device;

performing a fourth etch through the passivation layer of the logic chip to form a peripheral opening extending laterally to enclose a second interior region; and bonding the MEMS substrate to the logic chip through the protrusion and the peripheral opening.

6. A method for manufacturing a microelectromechanical systems (MEMS) package, the method comprising:

performing a first etch into a surface of a first substrate to form a recess in the first substrate;

bonding a second substrate to the surface of the first substrate, such that the recess is sealed;

performing a second etch into the second substrate to open the recess and to form a MEMS device in the second substrate;

providing a logic structure comprising a third substrate and an interconnect structure covering the third substrate, wherein the interconnect structure comprises a top interconnect layer and a passivation layer covering the top interconnect layer;

performing a third etch into the passivation layer to form a via opening exposing the top interconnect layer;

forming a getter layer covering the passivation layer and lining the via opening, such that the getter layer is electrically coupled to the top interconnect layer, wherein the getter layer is configured to absorb gas molecules from a surrounding environment;

performing a fourth etch into the getter layer to form a sensing electrode electrically coupled to the top interconnect layer through the via opening; and bonding the second substrate to the third substrate through the passivation layer.

7. The method according to claim 6, wherein bonding the second substrate to the surface of the first substrate comprises:

forming a dielectric layer conformally lining the surface of the first substrate and the recess of the first substrate; and fusion bonding the second substrate to the dielectric layer.

8. The method according to claim 6, further comprising:

forming a eutectic bonding layer covering the second substrate on an opposite side of the second substrate as the first substrate;

forming a hard mask layer covering the eutectic bonding layer;

performing a fifth etch into the eutectic bonding layer and the hard mask layer to pattern the eutectic bonding layer and the hard mask layer with a ring-shaped pattern;

performing a sixth etch into the second substrate with the eutectic bonding layer and the hard mask layer in place to form a protrusion in the second substrate, wherein the second substrate is bonded to the third substrate through the protrusion; and removing the hard mask layer while leaving the eutectic bonding layer.

9. The method according to claim 8, further comprising:

performing a seventh etch into the passivation layer to form a peripheral opening exposing the top interconnect layer and extending laterally to enclose the via opening and the sensing electrode, wherein the protrusion is bonded to the top interconnect within the peripheral opening.

10. The method according to claim 6, further comprising:

performing a planarization into the second substrate to reduce a thickness of the second substrate before performing the second etch.

11. The method according to claim 6, wherein performing the second etch comprises forming the MEMS device with a proof mass and a pair of springs, wherein the proof mass is formed between the springs, and wherein the springs are formed suspending the proof mass over the recess.

12. The method according to claim 11, wherein the second substrate is bonded to the third substrate so the proof mass is directly over the sensing electrode.

13. The method according to claim 6, wherein the providing comprises:

forming electronic devices over and recessed into the third substrate;

forming interconnect layers and via layers alternatingly stacked within an interlayer dielectric (ILD) layer, wherein the interconnect layers include the top interconnect layer, and wherein the ILD layer, the interconnect layers, and the via layers are formed covering the electronic devices; and forming the passivation layer covering the ILD layer, the interconnect layers, and the via layers.

14. The method according to claim 13, wherein the top interconnect layer is made up of a plurality of conductive segments that are laterally spaced from each other, wherein the interconnect layers and the via layers are formed so as to electrically couple a conductive segment of the top interconnect layer to at least one of the electronic devices, and wherein the third etch is performed to form the via opening exposing the conductive segment.

15. A method for manufacturing a microelectromechanical systems (MEMS) package, the method comprising:

performing a first etch into a first substrate to form a recess in the first substrate;

bonding a second substrate to the first substrate, such that the recess is sealed, wherein the first and second substrates are bulk semiconductor substrates;

after bonding the second substrate to the first substrate, thinning the second substrate to reduce a thickness of the second substrate;

performing a second etch into the second substrate to form a protrusion protruding vertically and extending laterally to enclose an interior region of the second substrate that overlaps with the recess;

performing a third etch into the interior region of the second substrate to form a MEMS device laterally enclosed by the protrusion;

providing a logic structure comprising a third substrate and an interconnect structure covering the third substrate, wherein the interconnect structure comprises a top interconnect layer and a passivation layer covering the top interconnect layer;

performing a fourth etch into the passivation layer to form a via opening exposing the top interconnect layer;

forming a getter layer covering the passivation layer and conformally lining the via opening, such that the getter layer is electrically coupled to the top interconnect layer, wherein the getter layer is configured to absorb gas molecules;

performing a fifth etch into the getter layer to form a sensing electrode electrically coupled to the top interconnect layer through the via opening;

after the fifth etch, performing a sixth etch into the passivation layer to form a peripheral opening exposing the top interconnect layer and laterally enclosing the sensing electrode and the via opening; and bonding the protrusion of the second substrate to the top interconnect layer within the peripheral opening.

16. The method according to claim 15, further comprising:
  forming a eutectic bonding layer covering the second substrate on an opposite side of the second substrate as the first substrate;
  forming a hard mask layer covering the eutectic bonding layer;
  performing a seventh etch into the eutectic bonding layer and the hard mask layer to pattern the eutectic bonding layer and the hard mask layer with a ring-shaped pattern, wherein the second etch is performed with the eutectic bonding layer and the hard mask layer in place; and
  removing the hard mask layer while leaving the eutectic bonding layer.

17. The method according to claim 16, wherein bonding the protrusion of the second substrate to the top interconnect layer comprises eutectic bonding, and wherein bonding the second substrate to the first substrate comprises:
  forming a dielectric layer conformally lining the recess of the first substrate; and
  fusion bonding the second substrate to the dielectric layer.

18. The method according to claim 15, wherein the providing comprises:
  forming electronic devices over and recessed into the third substrate, wherein the third substrate is a bulk semiconductor substrate;
  forming interconnect layers and via layers alternatingly stacked within an interlayer dielectric (ILD) layer, wherein the interconnect layers include the top interconnect layer, wherein the ILD layer, the interconnect layers, and the via layers are formed covering the electronic devices, and wherein the interconnect layers and the via layers are formed so as to electrically couple the top interconnect layer to one of the electronic devices; and
  forming the passivation layer covering the ILD layer, the interconnect layers, and the via layers.

19. The method according to claim 6, further comprising: forming the getter layer of titanium tungsten.

20. The method according to claim 6, further comprising: forming the getter layer of a titanium alloy.

\* \* \* \* \*